(12) United States Patent
Tailliet

(10) Patent No.: US 6,184,719 B1
(45) Date of Patent: Feb. 6, 2001

(54) DEVICE FOR NEUTRALIZING AN ELECTRONIC CIRCUIT

(75) Inventor: François Tailliet, Epinay sur Seine (FR)

(73) Assignee: STMicroelectronics S.A., Gentilly (FR)

( * ) Notice: Under 35 U.S.C. 154(b), the term of this patent shall be extended for 0 days.

(21) Appl. No.: 09/405,250

(22) Filed: Sep. 24, 1999

(30) Foreign Application Priority Data

Sep. 25, 1998 (FR) .................................................. 98 12187

(51) Int. Cl.$^7$ .................................................. G01R 29/02
(52) U.S. Cl. .................................................. 327/34; 327/20
(58) Field of Search .................................. 327/18, 20, 21, 327/23, 26, 31, 34, 35, 36, 37, 38

(56) References Cited

U.S. PATENT DOCUMENTS

| 4,434,403 | * | 2/1984 | Chang .................................. 328/120 |
| 4,471,235 | * | 9/1984 | Sakhuja et al. ........................ 307/234 |
| 4,857,760 | * | 8/1989 | Stuebing .............................. 307/234 |
| 5,155,380 | | 10/1992 | Hwang et al. ......................... 307/269 |
| 5,225,715 | * | 7/1993 | Mori et al. ............................ 307/265 |
| 5,274,591 | | 12/1993 | Waller et al. ........................ 365/189.5 |
| 5,455,840 | | 10/1995 | Nakauchi et al. ..................... 375/371 |
| 5,461,649 | | 10/1995 | Bailey et al. .......................... 327/28 |
| 5,812,429 | | 9/1998 | Downey et al. ....................... 364/572 |

\* cited by examiner

*Primary Examiner*—Jeffrey Zweizig
(74) *Attorney, Agent, or Firm*—Theodore E. Galanthay; Stephen C. Bongini; Fleit, Kain, Gibbons, Gutman & Bongini P.L.

(57) ABSTRACT

A device is provided for neutralizing an electronic circuit whose rate is set by a clock signal in the event of an anomaly in the clock signal. The device includes an inhibition circuit for selectively inhibiting operation of the electronic circuit, and an anomaly detector for activating the inhibition circuit to inhibit operation of the electronic circuit as soon as an anomaly is detected in the clock signal. In one preferred embodiment, the anomaly detector includes two monostable circuits and a logic circuit. The first monostable circuit receives the clock signal and outputs a first pulse at each trailing edge of the clock signal, and the second monostable circuit receives the clock signal and outputs a second pulse at each leading edge of the clock signal. The logic circuit receives the first and second pulses and outputs an activation signal to the inhibition circuit whenever the clock signal shows an anomaly. Also provided is a memory device that includes at least one neutralization device for neutralizing the memory device in the event of an anomaly in a clock signal.

22 Claims, 4 Drawing Sheets

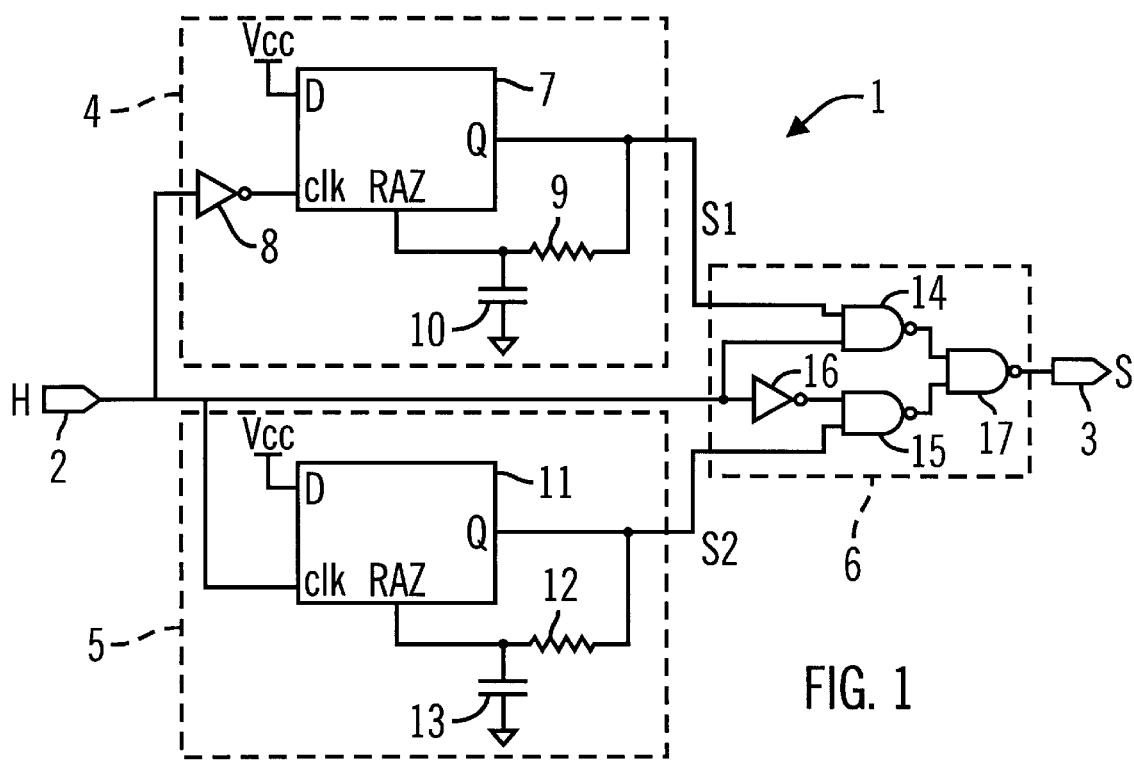
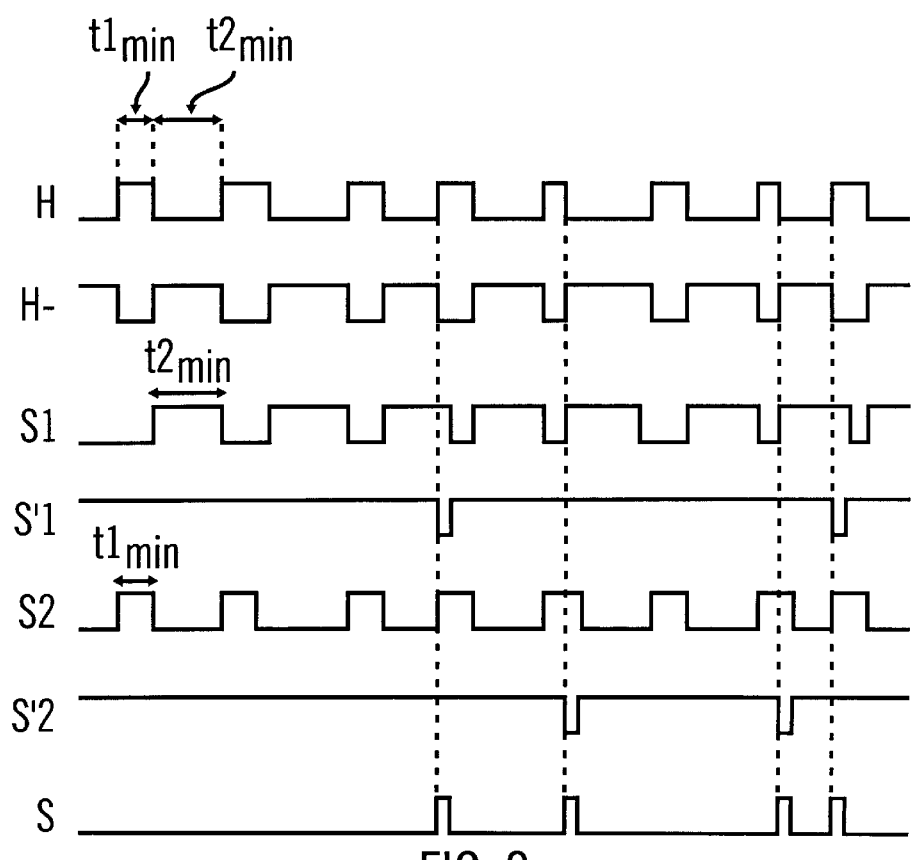

DEVICE FOR NEUTRALIZING AN ELECTRONIC CIRCUIT

CROSS-REFERENCE TO RELATED APPLICATIONS

This application is based upon and claims priority from prior French Patent Application No. 98-12187, filed Sep. 25, 1998, the entire disclosure of which is herein incorporated by reference.

BACKGROUND OF THE INVENTION

1. Field of the Invention

The present invention relates to electronic circuits, and more specifically to a device for neutralizing an electronic circuit in the event of an anomaly in a clock signal.

2. Description of Related Art

In memory or microprocessor-type integrated circuits, a specified number of instructions (or micro-instructions) is executed during each period of the clock signal. For example, in an EEPROM, several clock periods are needed to perform one read or write cycle. The clock signal is generally generated by an external clock circuit. The duration of the high states (or pulses) of the clock signal and of the low states is fixed to ensure the proper operation of the electronic circuit. The minimum times for either of these states are generally specified in the specification of the circuit.

Sometimes the clock signal may have defects or anomalies corresponding to an excessively short duration of one of the states of the clock signal (i.e., the duration of the state in question is smaller than the corresponding minimum duration defined in the specification of the circuit). For example, a parasitic pulse may appear between two successive pulses of the clock signal. There are many causes for the presence of such anomalies in the clock signal. In particular, they may reveal a problem of electromagnetic compatibility. This deformation of the clock signal either interrupts the execution of the instruction currently being executed by the electronic circuit and stops the operation of this circuit, or generates the execution of a wrong instruction.

SUMMARY OF THE INVENTION

In view of these drawbacks, it is an object of the present invention to overcome the above-mentioned drawbacks and to prevent such undesirable consequences by providing a device that neutralizes the operation of the electronic circuit in the event of anomalies in the clock signal.

Another object of the present invention is to provide a device for neutralizing an electronic circuit whose rate is set by a clock signal in the event of an anomaly in the clock signal. Such anomalies include a duration of a pulse of the clock signal that is smaller than a first threshold value, and a duration between two pulses of the clock signal that is smaller than a second threshold value. The device includes an anomaly detector that activates an inhibition circuit to inhibit the operation of the electronic circuit when an anomaly is detected in the clock signal.

According to one embodiment of the present invention, the inhibition circuit temporarily interrupts the supply of the electronic circuit when an activation signal is received.

According to another embodiment of the present invention, the inhibition circuit temporarily neutralizes the electronic circuit when an activation signal is received.

According to yet another embodiment of the present invention, when an activation signal is received, the inhibition circuit neutralizes control signals from a control block of the electronic in order to prevent the execution of any operation in the electronic circuit.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

BRIEF DESCRIPTION OF THE DRAWINGS

FIG. 1 shows a block diagram of an anomaly detector according to a preferred embodiment of the present invention;

FIG. 2 shows timing diagrams of signals to illustrate the operation of the anomaly detector of FIG. 1;

DETAILED DESCRIPTION OF PREFERRED EMBODIMENTS

Figure 3A:
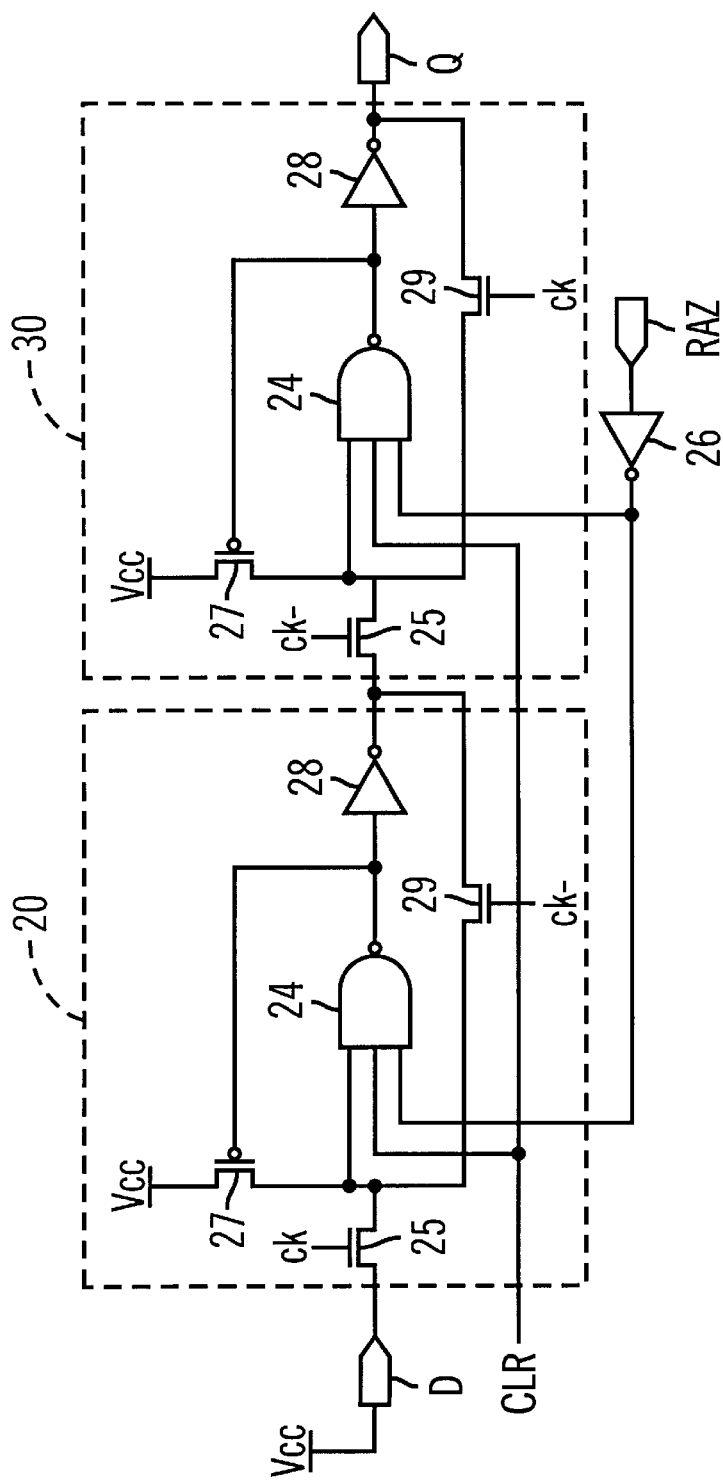
FIGS. 3A and 3B show circuit diagrams for one exemplary embodiment of a leading edge triggered D-type flip-flop for use in the anomaly detector of FIG. 1.

Preferred embodiments of the present invention will be described in detail hereinbelow with reference to the attached drawings.

The following description describes devices for neutralizing the operation of an electronic circuit whose rate is set by a clock signal H when this signal shows anomalies. The neutralization device includes an anomaly detector and an inhibition circuit for inhibiting the operation of the electronic circuit. The inhibition circuit is activated by the anomaly detector when an anomaly is detected in the clock signal H. The anomaly detector is responsible for producing an activation pulse whenever the clock signal H has a pulse whose duration is below a threshold value $t1_{min}$ or when the duration between two pulses of the clock signal is smaller than another threshold value $t2_{min}$. In some embodiments, the two threshold values are equal.

FIG. 1 shows a block diagram of an anomaly detector according to a preferred embodiment of the present invention. This detector 1 has an input 2 to which there is applied the clock signal H to be monitored and an output 3 delivering an activation pulse whenever the signal H has an anomaly. The anomaly detector also includes two monostable circuits 4 and 5 and a logic circuit 6. The monostable circuit 4 has the task of delivering a pulse whose duration is equal to $t2_{min}$ at each trailing edge of the clock signal H. This monostable circuit includes a leading-edge-triggered D-type flip-flop circuit 7 that is switched or triggered at the leading edges of the signal applied to its clock input clk and an RC (resistor-capacitor) type network connected between the Q output of the flip-flop circuit and its resetting input RAZ. The D signal input of the flip-flop 7 is connected to a supply terminal Vcc.

The input 2 of the anomaly detector is connected through an inverter 8 to the clock input clk of the flip-flop circuit 7. Thus, the flip-flop circuit 7 is switched at the leading edges of the inverted clock signal H–, (i.e., at the trailing edges of clock signal H). The RC type network of the monostable circuit 4 consists of a resistor 9 connected between the Q output and the resetting input RAZ of the flip-flop circuit 7 and a capacitor 10 connected between the resetting input RAZ and ground. The RC type network sets the duration of the pulse delivered by the flip-flop circuit 7. If it is assumed that the flip-flop circuit is reset when the voltage applied to the resetting input RAZ is greater than Vcc/2, then the duration $t2_{min}$ of the pulse delivered by the flip-flop circuit 7 is equal to $R_9*C_{10}*Log2$, with $R_9$ and $C_{10}$ respectively designating the resistance of the resistor 9 and the capacitance of the capacitor 10.

FIG. 3 shows one exemplary embodiment of such a leading edge triggered flip-flop circuit, which is described below. Like the monostable circuit 4, the monostable circuit 5 includes a leading edge triggered D-type flip-flop circuit 11 that switches at the leading edge of the signal applied to its clock input clk and an RC type network connected between the Q output and the resetting input RAZ of the flip-flop. The input 2 of the detector is directly connected to the clock input clk of the flip-flop circuit 11 and the D input of the flip-flop circuit is connected to the supply voltage Vcc. Thus, the flip-flop circuit 11 delivers a pulse at each leading edge of the clock signal H. The duration of this pulse is fixed by the RC network.

The RC network consists of a resistor 12 connected between the Q output and the resetting input RAZ of the flip-flop circuit 11 and a capacitor 13 connected between the resetting input RAZ and ground. The values of the elements 12 and 13 (i.e., $R_{12}$ and $C_{13}$) are chosen so as to set the duration $t1_{min}$, which is equal to $R_{12}*C_{13}*Log2$. The pulses generated by the monostable circuits 4 and 5 are processed by the logic circuit 6 so as to generate an activation pulse whenever the signal H has an anomaly.

The logic circuit 6 includes three NAND-type gates 14, 15, and 17. The first NAND-type gate 14 has its first input connected to the Q output of the monostable circuit 4 and its second input connected to the input 2 of the detector. The second NAND-type gate 15 has its first input connected to the input 2 of the detector through an inverter 16 and its second input connected to the Q output of the monostable circuit 5. The third NAND-type gate 17 has its first input connected to the output of gate 14, its second input connected to the output of gate 15 and its output connected to the output 3 of the detector.

The operation of the anomaly detector is illustrated by the timing diagrams shown in FIG. 2. H and H– respectively designate the clock signal and the inverted clock signal supplied to the detector. S1 and S2 designate the signals at the Q outputs of the monostable circuits 4 and 5, respectively. S'1 and S'2 designate the signals at the outputs of the logic gates 14 and 15, respectively. Finally, S designates the signal at the output 3 of the anomaly detector. In this example, the clock signal H has four anomalies.

The first and fourth anomalies correspond to an excessively short duration (less than $t2_{min}$) of the interval between two pulses of the clock signal. These anomalies are detected by the combination of monostable circuit 4 and logic gate 14. The second and third anomalies correspond to excessively short pulses of the clock signal (smaller than $t1_{min}$). They are detected by the combination of monostable circuit 5 and logic gate 15. Logic gate 17 is used to combine and invert the signals S'1 and S'2 from logic gates 14 and 15 so as to show positive activation pulses whenever the clock signal has anomalies.

Figure 3B:
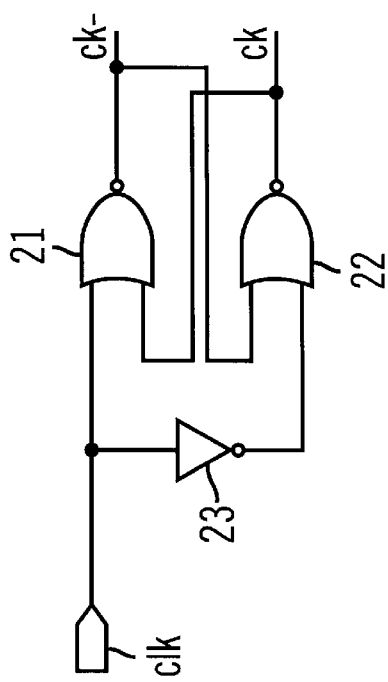

One exemplary embodiment of the leading edge triggered flip-flop circuit is shown in FIGS. 3A and 3B. This flip-flop circuit has two identical parts: master part 20 and slave part 30 that are cascade-connected and controlled by complementary clock signals ck and ck–. The signals ck and ck– are generated from the clock signal H applied to the input clk of the flip-flop circuit. To generate these signals, two NOR-type gates 21 and 22 with two inputs are cross-coupled (i.e., the output of gate 21 is connected to a first input of the gate 22 and vice versa). The second input of gate 21 is connected to the input clk of the flip-flop circuit and the second input of gate 22 is also connected to the input clk of the flip-flop circuit through an inverter 23.

The master part 20 has a three-input NAND-type logic gate 24. The first input of gate 24 is connected to the D signal input of the flip-flop through an NMOS transistor 25. The second input of gate 24 receives a signal CLR to reset the flip-flop circuit when it is powered on and the third input is connected to the resetting input RAZ of the flip-flop circuit through an inverter 26. The transistor 25 is controlled by the signal ck. The output signal of gate 24 is used to control a PMOS transistor 27 connecting the first input of gate 24 to the supply terminal Vcc of the flip-flop circuit. The output signal of gate 24 is inverted by an inverter 28, with the output of the inverter constituting the output of the master part 20. The first input of gate 24 and the output of the inverter 28 are connected through an NMOS transistor 39 controlled by the signal ck–.

The structure of the slave part 30 is identical to that of the master part (references 21 to 29 designate both the elements of the master part and the slave part 30). However, the signals ck and ck– controlling transistors 25 and 29 of the slave part are inverted with respect to those signals of the master part. Furthermore, transistor 25 of the slave part 30 is responsible for connecting not the first input of gate 24 to the D input of the flip-flop circuit, but the output of the master part 20 to the first input of the gate 24 of the slave part. Further, the output of the slave part 30 is connected to the Q output of the flip-flop circuit. The operation of such a flip-flop circuit is known to those of ordinary skill in the art and will not be further described.

As explained above, the anomaly detector 1 of the preferred embodiment delivers an activation pulse as soon as it detects an anomaly in the clock signal H. This pulse can then be used to activate an inhibition circuit that prevents the operation of the electronic circuit. According to a first embodiment shown in FIG. 4A, the inhibition circuit is responsible for temporarily interrupting the supply of the electronic circuit. This interruption of the supply of the circuit involves first turning off the circuit and then powering it on again in a second stage. This twofold action on the circuit will not only make it possible to interrupt the operation of the electronic circuit but could also enable it to be released if it should get blocked in the event of anomalies in the clock signal, which is something that may happen with sequential logic.

Figure 4A:
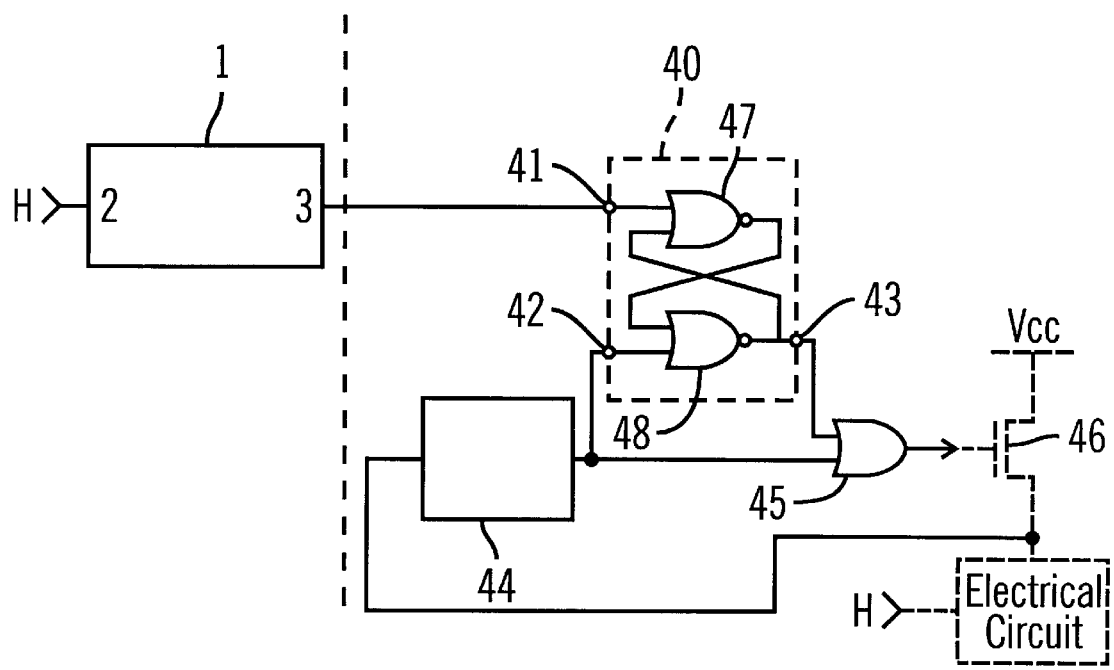
FIG. 4A shows a block diagram of a neutralization device according to one embodiment of the present invention for momentarily interrupting the supply of the circuit when an anomaly is detected in the clock signal.

Referring to FIG. 4A, the inhibition circuit includes a bistable RS-type flip-flop circuit 40 having a setting input 41, a resetting input 42, and an output 43. The setting input 41 of the bistable flip-flop circuit 40 is connected to the output 3 of the anomaly detector 1. The resetting input 42 of the flip-flop circuit 40 is connected to the output of a circuit 44 that indicates the level of the supply voltage for the electronic circuit. Circuit 44 delivers a high voltage level or resetting signal when the level of the supply voltage of the electronic circuit is below a threshold level, below which the supply is considered to be insufficient. This resetting signal corresponds to a "Power On Reset" signal. The structure of circuit 44 is well known to those of ordinary skill in the art and will not be further explained.

The output 43 of the flip-flop circuit 40 is connected to a first input of a two-input OR-type gate 45. The second input of this gate is connected to the output of the indicator circuit 44. The output of the gate 45 delivers a signal for controlling a transistor 46 to interrupt the power supply of the electronic circuit when the control signal is at a high level. In this exemplary embodiment, the flip-flop circuit 40 is formed of two NOR-type cross-coupled logic gates 47 and 48. The inhibition circuit operates as follows. When the detector 1 delivers an activation pulse, the flip-flop circuit 40 is set and the power supply of the electronic circuit is interrupted. As soon as the supply level of the electronic circuit goes below the borderline threshold fixed by the indicator circuit 44, this circuit delivers a high level signal and the flip-flop circuit 40 is reset. The electronic circuit is then supplied with power again, and the output level of the indicator circuit 44 returns to a low level as soon as the supply voltage reaches a sufficient voltage level.

Figure 4B:
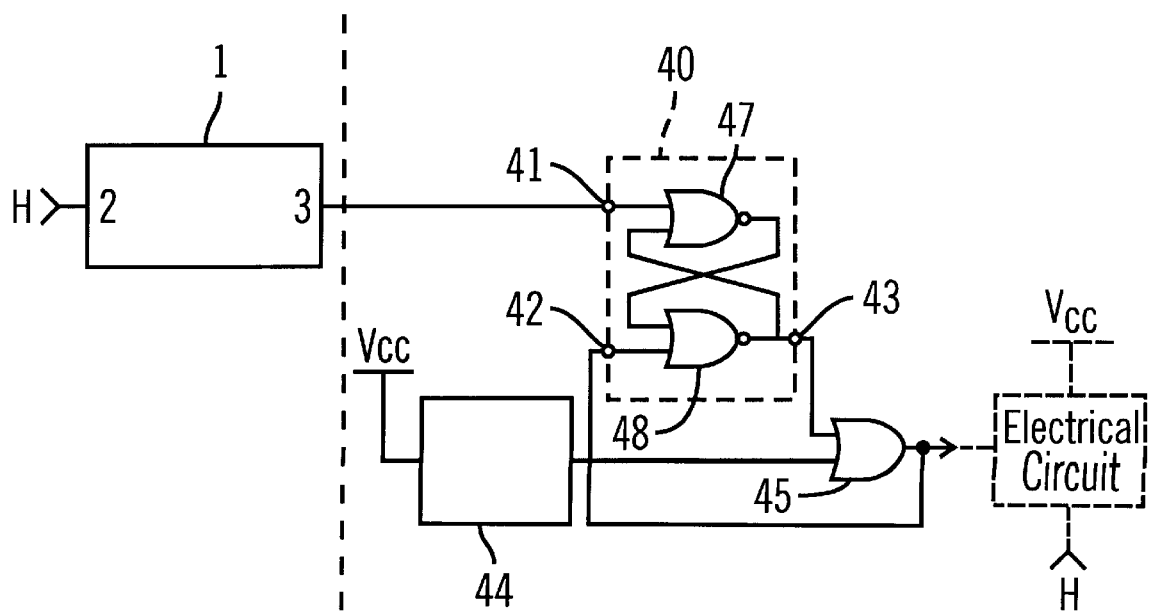
FIG. 4B shows a block diagram of a neutralization device according to one embodiment of the present invention for momentarily delivering a neutralization signal when an anomaly is detected in the clock signal.

According to a second embodiment shown in FIG. 4B, the electronic circuit is neutralized as soon as an anomaly is detected in the clock signal H. The neutralizing device shown in FIG. 4B is a variant of the device of FIG. 4A. In this embodiment, the resetting input of the flip-flop circuit 40 is not connected to the output of the indicator circuit 44 but to the output of the OR-type logic gate 45. The output of the gate 45 is connected to a neutralizing input of the electronic circuit. A device of this kind delivers a neutralizing pulse when the signal H has an anomaly or when the supply voltage Vcc is no longer sufficient.

Figure 5:
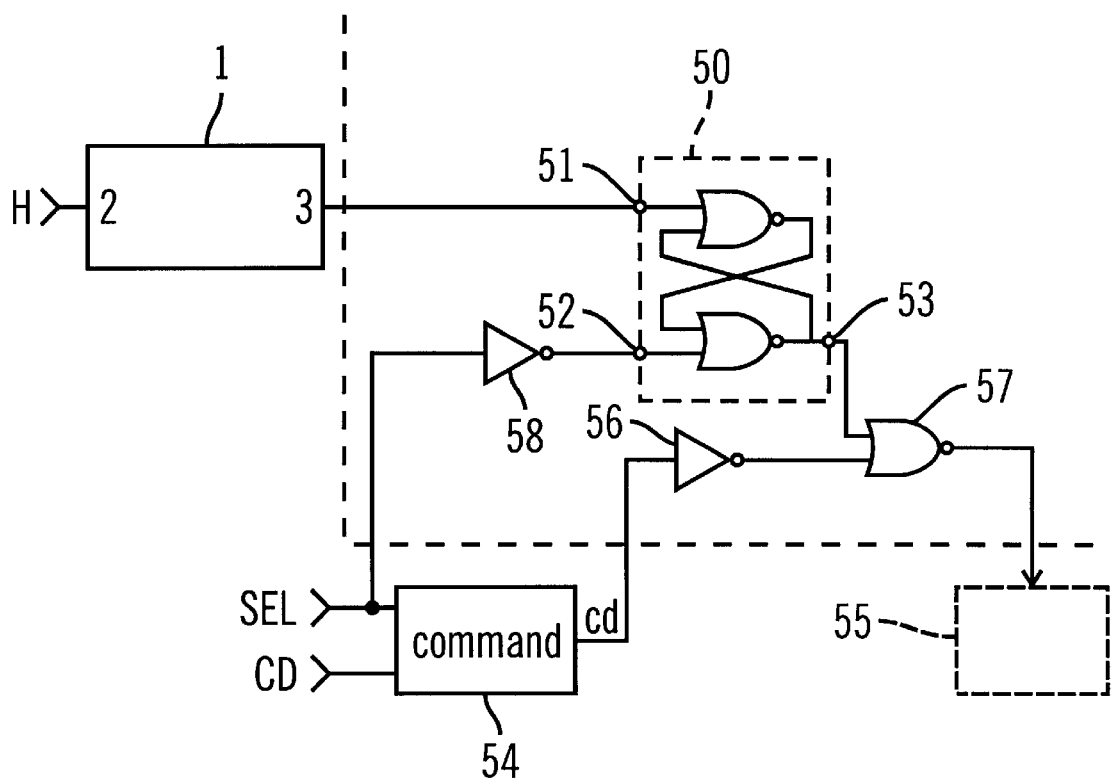
FIG. 5 shows a block diagram of a neutralization device according to one embodiment of the present invention for preventing all operations in a memory when an anomaly is detected in the clock signal.

According to another exemplary embodiment shown in FIG. 5, the inhibition circuit prevents any operation in the electronic circuit by modifying the state of the signals coming from a control block as soon as an anomaly is detected in the clock signal H. The embodiment of FIG. 5 is particularly suited to cases in which the electronic circuit to be neutralized is a memory. In this example, the neutralizing device of the present invention modifies the commands coming from the control block of the memory so as to prevent any read or write operation on the cells of the memory.

Referring to FIG. 5, the inhibition circuit includes an RS-type bistable flip-flop circuit 50 that is identical to that of FIGS. 4A and 4B. This flip-flop circuit has a setting input 51, a resetting input 52, and an output 53. The setting input 51 is connected to the output 3 of the anomaly detector 1 and the resetting input 52 is connected through an inverter 58 to an input of the memory that receives a selection signal SEL for the memory. The selection signal SEL is also applied to an input of a control block 54 for the memory. The selection signal SEL is active to select the memory whenever a read or write operation has to be performed therein. The control block 54 furthermore receives other control signals CD coming from the interface of the memory.

This block is designed to control the different elements of the memory, and especially circuitry for reading and writing 55 memory cells through a signal cd. In this exemplary embodiment, the inhibition circuit neutralizes the signal cd and thus prevents any read or write operation in the memory when it is activated. In particular, the inhibition signal is complemented by a NOR-type two-input gate 57. The output 53 of the flip-flop circuit 50 is connected to the first input of this gate and the signal cd coming from the control unit is applied through an inverter 56 to the second input of the gate 57. The output signal of the gate 57 is used to control the read and write circuitry 55.

This neutralization device operates as follows. When the detector 1 delivers an activation pulse, the flip-flop circuit 50 is set and the memory read and write circuitry 57 is neutralized regardless of the state of the signal cd. The flip-flop circuit 50 is reset when the memory is again selected for another read or write operation. Further, according to this embodiment, the neutralization device can be used as a frequency limiter if a user should seek to use the memory at a higher frequency than the one for which it has been commercially distributed. In particular, the maximum clock frequency is dictated by the monostable circuits of the neutralization device. If the rate of the memory is set by a clock signal with a higher frequency, the neutralization device prevents operation of the memory.

The present invention is particularly suited for use with memory or microprocessor-type integrated circuits in which the rate at which instructions are executed is set by a clock signal.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A device for neutralizing an electronic circuit whose rate is set by a clock signal in the event of an anomaly in the clock signal, the anomaly consisting of a duration of a pulse of the clock signal smaller than a first threshold value or a duration between two pulses of the clock signal smaller than a second threshold value, said device comprising:

an inhibition circuit for selectively inhibiting operation of the electronic circuit; and an anomaly detector for activating the inhibition circuit to inhibit operation of the electronic circuit as soon as an anomaly is detected in the clock signal.

2. The device as defined in claim 1, wherein the first and second threshold values are equal.

3. The device as defined in claim 1, wherein the anomaly detector includes:

a first monostable circuit receiving the clock signal and outputting a first pulse at each trailing edge of the clock signal, the duration of the first pulse being equal to the second threshold value;

a second monostable circuit receiving the clock signal and outputting a second pulse at each leading edge of the clock signal, the duration of the second pulse being equal to the first threshold value; and a logic circuit receiving the first and second pulses and outputting an activation signal to the inhibition circuit whenever the clock signal shows an anomaly.

4. The device as defined in claim 3, wherein the inhibition circuit momentarily interrupts a supply of the electronic circuit when the activation signal is received from the anomaly detector.

5. The device as defined in claim 4, wherein the inhibition circuit includes:

an indication circuit generating a resetting signal when the level of the supply of the electronic circuit is insufficient;

a bistable circuit having a setting input that receives the activation signal from the anomaly detector, a resetting input that receives the resetting signal from the indication circuit, and an output; and an OR gate receiving the output of the bistable circuit and the resetting signal from the indication circuit, and outputting an interruption signal for momentarily interrupting the supply of the electronic circuit.

6. The device as defined in claim 3, wherein the inhibition circuit momentarily delivers a neutralization signal when the activation signal is received from the anomaly detector.

7. The device as defined in claim 6, wherein the inhibition circuit includes:
   an indication circuit generating resetting signal when the level of a supply of the electronic circuit is insufficient;
   a bistable circuit having a setting input that receives the activation signal from the anomaly detector, a resetting input, and an output; and
   an OR gate receiving the output of the bistable circuit and the resetting signal from the indication circuit, and outputting the neutralization signal to neutralize the electronic circuit.

8. The device as defined in claim 7, wherein the output of the OR gate is supplied to the resetting input of the bistable circuit.

9. The device as defined in claim 3,
   wherein the electronic circuit includes a control block that outputs control signals, and
   when the activation signal is received from the anomaly detector, the inhibition circuit neutralizes the control signals from the control block so as to prevent the execution of any operation in the electronic circuit.

10. The device as defined in claim 9, wherein the inhibition circuit includes:
    a bistable circuit having a setting input that receives the activation signal from the anomaly detector, a resetting input, and an output; and
    a logic gate coupled to the output of the bistable circuit and an output of the control block, the logic gate preventing the output of the control block from reaching an operational portion of the electronic circuit when the activation signal is received from the anomaly detector.

11. An information processing device whose rate is set by a clock signal, the information processing device including at least one neutralization device for neutralizing the information processing device in the event of an anomaly in the clock signal, said neutralization device comprising:
    an inhibition circuit for selectively inhibiting operation of the information processing device; and
    an anomaly detector for activating the inhibition circuit to inhibit operation of the information processing device as soon as an anomaly is detected in the clock signal.

12. The information processing device as defined in claim 11, wherein the first and second threshold values are equal.

13. The information processing device as defined in claim 11, wherein the anomaly detector includes:
    a first monostable circuit receiving the clock signal and outputting a first pulse at each trailing edge of the clock signal, the duration of the first pulse being equal to the second threshold value;
    a second monostable circuit receiving the clock signal and outputting a second pulse at each leading edge of the clock signal, the duration of the second pulse being equal to the first threshold value; and
    a logic circuit receiving the first and second pulses and outputting an activation signal to the inhibition circuit whenever the clock signal shows an anomaly.

14. The information processing device as defined in claim 13, wherein the inhibition circuit momentarily interrupts a supply of the information processing device when the activation signal is received from the anomaly detector.

15. The information processing device as defined in claim 13, wherein the inhibition circuit momentarily delivers a neutralization signal when the activation signal is received from the anomaly detector.

16. The information processing device as defined in claim 13, further comprising:
    a control block that outputs control signals,
    wherein when the activation signal is received from the anomaly detector, the inhibition circuit neutralizes the control signals from the control block so as to prevent the execution of any operation in the information processing device.

17. A memory device whose rate is set by a clock signal, the memory device including at least one neutralization device for neutralizing the memory device in the event of an anomaly in the clock signal, said neutralization device comprising:
    an inhibition circuit for selectively inhibiting operation of the memory device; and
    an anomaly detector for activating the inhibition circuit to inhibit operation of the memory device as soon as an anomaly is detected in the clock signal.

18. The memory device as defined in claim 17, wherein the first and second threshold values are equal.

19. The memory device as defined in claim 17, wherein the anomaly detector includes:
    a first monostable circuit receiving the clock signal and outputting a first pulse at each trailing edge of the clock signal, the duration of the first pulse being equal to the second threshold value;
    a second monostable circuit receiving the clock signal and outputting a second pulse at each leading edge of the clock signal, the duration of the second pulse being equal to the first threshold value; and
    a logic circuit receiving the first and second pulses and outputting an activation signal to the inhibition circuit whenever the clock signal shows an anomaly.

20. The memory device as defined in claim 19, wherein the inhibition circuit momentarily interrupts a supply of the memory device when the activation signal is received from the anomaly detector.

21. The memory device as defined in claim 19, wherein the inhibition circuit momentarily delivers a neutralization signal when the activation signal is received from the anomaly detector.

22. The memory device as defined in claim 19, further comprising:
    a control block that outputs control signals,
    wherein when the activation signal is received from the anomaly detector, the inhibition circuit neutralizes the control signals from the control block so as to prevent the execution of any operation in the memory device.

* * * * *